(12) United States Patent
Tang et al.

(10) Patent No.: US 12,567,860 B2
(45) Date of Patent: Mar. 3, 2026

(54) METHOD OF ASSESSING A USER INPUT AT A VIRTUAL BUTTON OF A USER-INPUT SYSTEM AND A USER-INPUT SYSTEM

(71) Applicant: UltraSense Systems, Inc., San Jose, CA (US)

(72) Inventors: Hao-Yen Tang, San Jose, CA (US); Sina Akhbari, San Jose, CA (US)

(73) Assignee: UltraSense Systems, Inc., San Jose, CA (US)

( * ) Notice: Subject to any disclaimer, the term of this patent is extended or adjusted under 35 U.S.C. 154(b) by 805 days.

(21) Appl. No.: 17/969,830

(22) Filed: Oct. 20, 2022

(65) Prior Publication Data

US 2023/0119796 A1 Apr. 20, 2023

Related U.S. Application Data

(60) Provisional application No. 63/257,668, filed on Oct. 20, 2021.

(51) Int. Cl.
H03K 17/96 (2006.01)

(52) U.S. Cl.
CPC ....... H03K 17/964 (2013.01); H03K 17/9625 (2013.01)

(58) Field of Classification Search
CPC ............. H03K 17/964; H03K 17/9625; H03K 2217/9651; H03K 17/9643
See application file for complete search history.

(56) References Cited

U.S. PATENT DOCUMENTS

| | | | |
|---|---|---|---|
| 4,412,544 A | 11/1983 | Beretsky et al. | |
| 8,289,290 B2 * | 10/2012 | Klinghult | G06F 3/0418 |
| | | | 345/173 |
| 8,676,540 B1 | 3/2014 | Welch et al. | |
| 9,235,265 B2 * | 1/2016 | Karamath | G06F 3/016 |
| 9,339,169 B2 * | 5/2016 | Rentschler | B32B 3/30 |
| 9,349,552 B2 * | 5/2016 | Huska | H01H 13/85 |
| 10,068,728 B2 * | 9/2018 | Huska | H01H 13/85 |
| 10,466,844 B1 | 11/2019 | Tang et al. | |
| 10,503,313 B2 * | 12/2019 | Datta | G06F 1/169 |

(Continued)

FOREIGN PATENT DOCUMENTS

| | | | | |
|---|---|---|---|---|
| DE | 102020208572 A1 * | 1/2022 | ............ | G06F 3/043 |
| DE | 102020208572 B4 * | 6/2025 | ........ | G06F 3/04166 |

(Continued)

*Primary Examiner* — Pedro J Cuevas
(74) *Attorney, Agent, or Firm* — Perkins Coie LLP

(57) ABSTRACT

A method of assessing a user input at a virtual button of a user-input system includes: (A) configuring at least one force-measuring device including a plurality of piezoelectric micromechanical force-measuring elements (PMFEs); (B) configuring a cover layer of the user-input system including coupling the force-measuring device(s) to the cover layer at respective positions that are laterally displaced from a center point of the virtual button; (C) receiving, by each respective signal processor, the voltage signals from the PMFEs (PMFE voltage signals); (D) obtaining force-trend data from the PMFE voltage signals; and (E) assessing a user input in accordance with the force-trend data. Each of the PMFEs is configured to output voltage signals to the respective signal processor in accordance with a time-varying strain at the respective PMFE.

22 Claims, 12 Drawing Sheets

(56) References Cited

U.S. PATENT DOCUMENTS

| | | | |
|---|---|---|---|
| 10,585,534 B2 | 3/2020 | Tang et al. | |
| 10,719,175 B2 | 7/2020 | Akhbari et al. | |
| 10,775,938 B2 | 9/2020 | Tang et al. | |
| 10,817,062 B2 * | 10/2020 | Bernstein | G06F 3/041 |
| 10,936,107 B2 * | 3/2021 | Datta | G06F 3/016 |
| 11,687,160 B2 * | 6/2023 | Zhao | G06F 3/03547 |
| | | | 345/157 |
| 11,768,542 B1 * | 9/2023 | Dani | G06F 3/044 |
| | | | 345/174 |
| 11,836,297 B2 * | 12/2023 | Smith | H01H 13/7065 |
| 12,229,378 B1 * | 2/2025 | Barel | G06F 3/03547 |
| 12,260,022 B2 * | 3/2025 | Worfolk | G06F 3/016 |
| 12,429,951 B1 * | 9/2025 | Barel | G06F 3/03547 |
| 2001/0000666 A1 | 5/2001 | Wood et al. | |
| 2002/0005108 A1 | 1/2002 | Ludwig | |
| 2003/0144814 A1 | 7/2003 | Hama et al. | |
| 2003/0217873 A1 | 11/2003 | Paradiso et al. | |
| 2003/0233233 A1 | 12/2003 | Hong | |
| 2007/0260425 A1 | 11/2007 | Kim | |
| 2008/0024459 A1 * | 1/2008 | Poupyrev | G06F 3/0488 |
| | | | 345/173 |
| 2008/0316184 A1 | 12/2008 | D'Souza | |
| 2009/0002199 A1 * | 1/2009 | Lainonen | H03K 17/964 |
| | | | 341/20 |
| 2009/0157206 A1 | 6/2009 | Weinberg et al. | |
| 2009/0224161 A1 | 9/2009 | Fritsch et al. | |
| 2010/0117993 A1 | 5/2010 | Kent | |
| 2010/0139991 A1 | 6/2010 | Phillip et al. | |
| 2010/0258361 A1 | 10/2010 | Yamauchi et al. | |
| 2010/0261530 A1 * | 10/2010 | Thomas | A63F 13/245 |
| | | | 463/43 |
| 2011/0012869 A1 * | 1/2011 | Klinghult | G06F 1/3287 |
| | | | 345/173 |
| 2011/0061464 A1 | 3/2011 | Yi-Min | |
| 2011/0227872 A1 * | 9/2011 | Huska | G06F 3/016 |
| | | | 345/174 |
| 2012/0274609 A1 | 11/2012 | Sheng et al. | |
| 2012/0327025 A1 * | 12/2012 | Huska | H01H 13/85 |
| | | | 345/174 |
| 2013/0172671 A1 * | 7/2013 | Rentschler | A61B 1/0011 |
| | | | 156/247 |
| 2013/0345864 A1 | 12/2013 | Park et al. | |
| 2014/0022189 A1 | 1/2014 | Sheng et al. | |
| 2014/0071095 A1 | 3/2014 | Godsill | |
| 2015/0148674 A1 | 5/2015 | Park et al. | |
| 2015/0169136 A1 * | 6/2015 | Ganti et al. | |
| 2016/0179245 A1 * | 6/2016 | Johansson | G06F 3/0447 |
| | | | 345/174 |
| 2016/0216794 A1 | 7/2016 | Yoon et al. | |
| 2016/0246449 A1 | 8/2016 | Jarske | |
| 2016/0370862 A1 * | 12/2016 | Colgate | G06F 3/016 |
| 2017/0110504 A1 | 4/2017 | Panchawagh et al. | |
| 2017/0196507 A1 * | 7/2017 | Singh | A61B 5/4528 |
| 2017/0255338 A1 | 9/2017 | Medina | |
| 2017/0322290 A1 | 11/2017 | Ng et al. | |
| 2017/0336891 A1 * | 11/2017 | Rosenberg | G06F 3/04144 |
| 2017/0336903 A1 | 11/2017 | Rivaud et al. | |
| 2017/0336926 A1 | 11/2017 | Chaudhri et al. | |
| 2018/0032161 A1 | 2/2018 | Shi et al. | |
| 2018/0032211 A1 | 2/2018 | King | |
| 2018/0039392 A1 | 2/2018 | Kim et al. | |
| 2018/0095596 A1 * | 4/2018 | Turgeman | G06F 3/0346 |
| 2018/0164937 A1 | 6/2018 | Lynn | |
| 2018/0246612 A1 | 8/2018 | Lynn et al. | |
| 2018/0276439 A1 | 9/2018 | Strohmann et al. | |
| 2018/0276440 A1 | 9/2018 | Strohmann et al. | |
| 2018/0284892 A1 | 10/2018 | Kwon et al. | |
| 2018/0323783 A1 | 11/2018 | Bang et al. | |
| 2018/0369866 A1 * | 12/2018 | Sammoura | G06F 3/043 |
| 2019/0050618 A1 | 2/2019 | Khuri-Yakub | |
| 2019/0056837 A1 * | 2/2019 | Datta | G06F 3/016 |
| 2019/0074833 A1 | 3/2019 | Sheng | |
| 2019/0354209 A1 | 11/2019 | Tang | |
| 2019/0354210 A1 | 11/2019 | Akhbari et al. | |
| 2019/0354237 A1 | 11/2019 | Tang et al. | |
| 2019/0354238 A1 | 11/2019 | Akhbari et al. | |
| 2020/0117309 A1 * | 4/2020 | Datta | G06F 1/169 |
| 2021/0181041 A1 | 6/2021 | Tang | |
| 2021/0186454 A1 * | 6/2021 | Behzadi | A61B 7/023 |
| 2021/0239553 A1 | 8/2021 | Akhbari et al. | |
| 2021/0242393 A1 | 8/2021 | Tang | |
| 2021/0275129 A1 * | 9/2021 | Behzadi | A61B 7/023 |
| 2021/0278926 A1 | 9/2021 | Akhbari et al. | |
| 2021/0293641 A1 | 9/2021 | Tu et al. | |
| 2021/0293648 A1 | 9/2021 | Tu et al. | |
| 2024/0393896 A1 * | 11/2024 | King-Smith | G06F 3/046 |
| 2025/0306682 A1 * | 10/2025 | Barel | G06F 3/03547 |

FOREIGN PATENT DOCUMENTS

| | | | | |
|---|---|---|---|---|
| KR | 20240140094 A | * | 9/2024 | H10N 30/704 |
| WO | WO2018077761 | | 5/2018 | |

* cited by examiner

800

Start

Configure force-
measuring devices — 802

Configure cover layer — 804

Receive PMFE voltage
signals — 806

Obtain force-trend data —808

Assess user input — 810

End

METHOD OF ASSESSING A USER INPUT AT A VIRTUAL BUTTON OF A USER-INPUT SYSTEM AND A USER-INPUT SYSTEM

CROSS-REFERENCE TO RELATED APPLICATION(S)

This application claims the benefit of U.S. Provisional Patent Application No. 63/257,668 filed on Oct. 20, 2021, entitled "METHOD OF ASSESSING A USER INPUT AT A VIRTUAL BUTTON OF A USER-INPUT SYSTEM AND A USER-INPUT SYSTEM," which is incorporated herein by reference in its entirety.

BACKGROUND

Virtual buttons can be configured from force-measuring devices that include piezoelectric micromechanical force-measuring elements (PMFEs) coupled to a suitable cover layer. It would be desirable to configure such virtual button in a portable electronic apparatus, such as a smartphone. When installed in a portable electronic apparatus, PMFEs may be susceptible to temperature-induced deformation. For example, there is a temperature difference between a finger touching the portable electronic apparatus and the apparatus. This temperature difference or temperature gradient induces a deformation which includes thermal expansion and contraction. Accordingly, there is a need to distinguish the PMFE signals due to temperature-induced effects from PMFE signals attributable to user input.

SUMMARY OF THE INVENTION

In one aspect, a method of assessing a user input at a virtual button of a user-input system includes the following steps (A), (B), (C), (D), and (E). (A) includes configuring at least one force-measuring device including a respective plurality of piezoelectric micromechanical force-measuring elements (PMFEs). Each of the PMFEs is configured to output voltage signals to a respective signal processor in accordance with a time-varying strain at the respective PMFE. The PMFEs include a first PMFE and a second PMFE. (B) includes configuring a cover layer of the user-input system including coupling the force-measuring device(s) to the cover layer at respective positions that are displaced from a center point of the virtual button. (C) includes receiving, by each respective signal processor, the voltage signals from the PMFEs (PMFE voltage signals). (D) includes obtaining force-trend data from the PMFE voltage signals. (E) includes assessing a user input in accordance with the force-trend data.

In another aspect, a user-input system includes at least one force-measuring device, each force-measuring device including a respective signal processor and a respective plurality of piezoelectric micromechanical force-measuring elements (PMFEs), and a cover layer to which the force-measuring device(s) are coupled. Each of the PMFEs is configured to output voltage signals to the respective signal processor in accordance with a time-varying strain at the respective PMFE. The respective plurality of PMFEs includes a respective first PMFE and a respective second PMFE. Each of the force-measuring device(s) is coupled to the cover layer at respective positions that are laterally displaced from a center point of a respective virtual button. Each respective virtual button corresponds to one or more of the force-measuring devices. The signal processor of each force-measuring device is configured to receive the voltage signals from the respective PMFEs (PMFE voltage signals). At least one of the signal processors is configured to obtain force-trend data from the PMFE voltage signals. A user input is assessed in accordance with the force-trend data.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to a method of distinguishing between a touch-induced mechanical deformation and a temperature-induced mechanical deformation at a user-input system.

In this disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
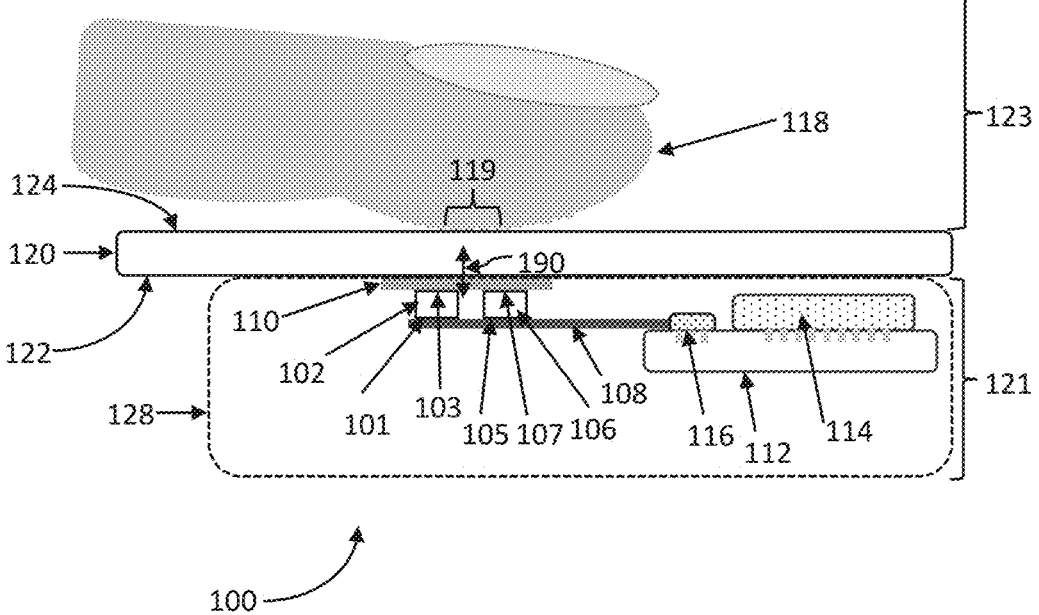
FIG. 1 is a schematic view of an illustrative input system.

FIG. 1 is a schematic view of an input system 100. In the example shown, the input system 100 includes force-measuring devices (102, 106) that are implemented as packaged integrated circuits (ICs) additionally including an optional touch-sensing functionality. Typically, the touch-sensing functionality is realized using ultrasonic transducers. Such devices that include touch-sensing functionality are sometimes referred to as force-measuring and touch-sensing integrated circuits (FMTSICs). A force-measuring device includes at least one strain-sensing element configured to output voltage signals in accordance with a time-varying strain at each respective strain-sensing element. For example, the strain-sensing element can be a piezoelectric micromechanical force-measuring element (PMFE) or a piezoresistive element. In the example shown, PMFEs are used in the force-measuring devices 102, 106. Each of the force-measuring devices 102, 106 has an electrical interconnection surface (bottom surface) 101, 105 and a top surface 103, 107. The force-measuring devices 102, 106 are mounted to a flexible circuit substrate (flexible circuit) 108 (e.g., an FPC or flexible printed circuit) on the electrical interconnection surfaces 101, 105. The flexible circuit substrate 108 is electrically and mechanically connected to a printed circuit board (PCB) 112 via a connector 116. Other ICs 114 are mounted on the PCB 112, and such other ICs 114 could be a microcontroller (MCU), microprocessor (MPU), and/or a digital signal processor (DSP), for example. These other ICs 114 could be used to run programs and algorithms to analyze and categorize touch events based on data received from the force-measuring devices 102, 106. Other ICs 114 can also be mounted to the flexible circuit. Generally, signal processor can be implemented in the force-measuring devices (102, 106) and/or the ICs 114. The signal processor can be implemented in a single IC, or in multiple ICs.

Input system 100 includes a cover layer 120 having an exposed outer surface 124 and an inner surface 122 opposite the outer surface. The cover layer 120 should be robust but should be sufficiently deformable such that a deformation of the cover layer is transmitted to the piezoelectric micromechanical force-measuring elements (PMFEs) in the force-measuring device, as described with reference to FIG. 4. FIG. 1 shows an example of a force-imparting point 119, which is an area where the finger 118 imparts a force to the cover layer 120 when touching, tapping, and/or pressing. The cover layer 120 can be a robust material that deforms when pressed by the finger 118. Examples of such robust materials are wood, glass, metal, plastic, leather, fabric, and ceramic. The cover layer 120 could also be a composite stack of any of the foregoing materials. The force-measuring devices 102, 106 are adhered to or attached to the inner surface 122 of the cover layer 120 by a layer of adhesive 110, for example. The choice of adhesive 110 is not particularly limited as long as the devices 102, 106 remain attached to the cover layer. The adhesive 110 could be double-sided tape, pressure sensitive adhesive (PSA), epoxy adhesive, or acrylic adhesive, for example. More generally, force-measuring devices 102, 106 are mechanically coupled to the inner surface 122 in the sense that a mechanical deformation of the cover layer is transmitted to the force-measuring devices 102, 106. In some embodiments, the force-measuring device includes ultrasonic transducers. Ultrasonic transducers that can be fabricated using micro-electromechanical systems (MEMS) technologies include piezoelectric micromechanical ultrasonic transducers (PMUTs) and capacitive micromechanical ultrasonic transducers (CMUTs). Since PMFEs, PMUTs, and CMUTs can be made using MEMS technology, it is possible to make a force-measuring device that incorporates both force-measuring elements (e.g., PMFEs) and ultrasonic transducers (e.g., PMUTs, CMUTs). Accordingly, a force-measuring device that additionally incorporates touch-sensing functionality is feasible. Such a force-measuring device, additionally incorporating touch-sensing functionality, in an integrated circuit form can be referred to as a force-measuring and touch-sensing integrated circuit or FMTSIC.

System 100 can be implemented in numerous apparatuses. For example, the force-measuring devices 102, 106 can replace conventional buttons on Smartphones, keys on computer keyboards, sliders, or track pads. The interior contents 128 of an apparatus (e.g., force-measuring device 102, 106, flexible circuit substrate 108, connector 116, PCB 112, ICs 114) can be sealed off from the exterior 123 of the cover layer 120, so that liquids on the exterior 123 cannot penetrate into the interior 121 of the apparatus. The ability to seal the interior of the system from the outside helps to make the apparatus, such as a Smartphone or laptop computer, waterproof. There are some applications, such as medical applications, where waterproof buttons and keyboards are strongly desired. The apparatus can be a mobile appliance (e.g., Smartphone, tablet computer, laptop computer), a household appliance (e.g., television, washing machine, dryer, light switches, air conditioner, refrigerator, oven, remote controller devices), a medical appliance, an industrial appliance, an office appliance, an automobile, or an airplane, for example.

Figure 2:
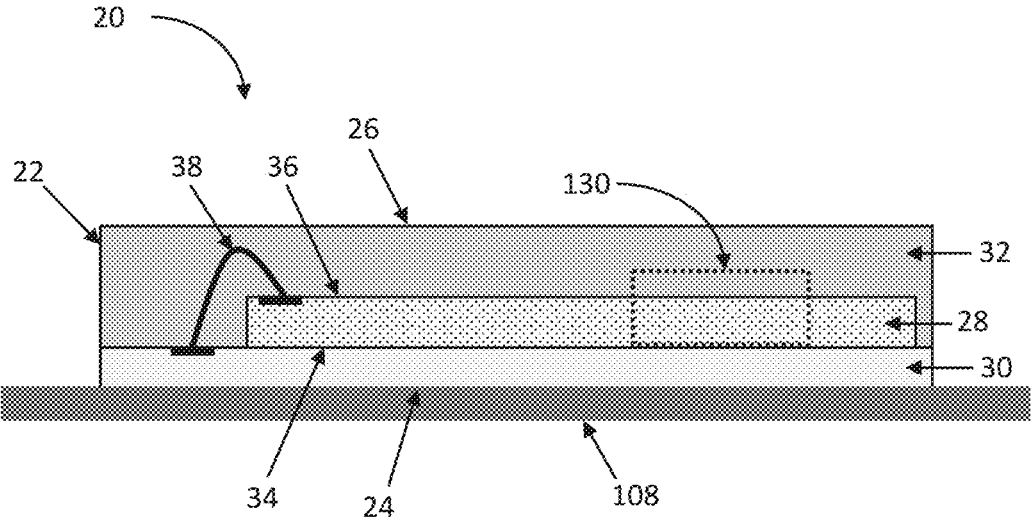
FIG. 2 is a schematic cross-sectional view of a force-measuring device.

The force-measuring device is shown in greater detail in FIG. 2. FIG. 2 is a cross-sectional view of a force-measuring device 20, which is one possible implementation of force-measuring device 102, 106 in FIG. 1. Force-measuring device 20 is shown encased in a package 22, with a top surface 26 and electrical interconnection surface (bottom surface) 24. Top surface 26 is analogous to surfaces 103, 107 in FIG. 1 and electrical interconnection surface 24 is analogous to surfaces 101, 105 in FIG. 1. The force-measuring device 20 includes a package substrate 30, semiconductor die (semiconductor chip) 28 mounted to the package substrate 30, and an encapsulating adhesive 32, such as an epoxy adhesive. After the semiconductor die 28 is mounted to the package substrate 30, wire bond connections 38 are formed between the die 28 and the package substrate 30. Then the entire assembly including the die 28 and the package substrate 30 are molded (encapsulated) in an epoxy adhesive 32. In the example shown in FIG. 1, the epoxy side (top surface 26) of the force-measuring device 102 is adhered to (coupled to) the inner surface 122 of the cover layer 120. The force-measuring device 102, 106 is shown mounted to the flexible circuit substrate 108. It is preferable that the force-measuring device have lateral dimensions no greater than 10 mm by 10 mm. In the example shown, the wire bond connection 38 is formed between the top surface 36 of the semiconductor die 28 and the package substrate 30. Alternatively, electrical interconnections can be formed between the bottom surface 34 of the semiconductor die 28 and the package substrate. The semiconductor die 28 consists of an application-specific integrated circuit (ASIC) portion and a micro-electromechanical systems (MEMS) portion. A selected portion 130 of the semiconductor die 28 is shown in cross-section in FIG. 3.

Figure 3:
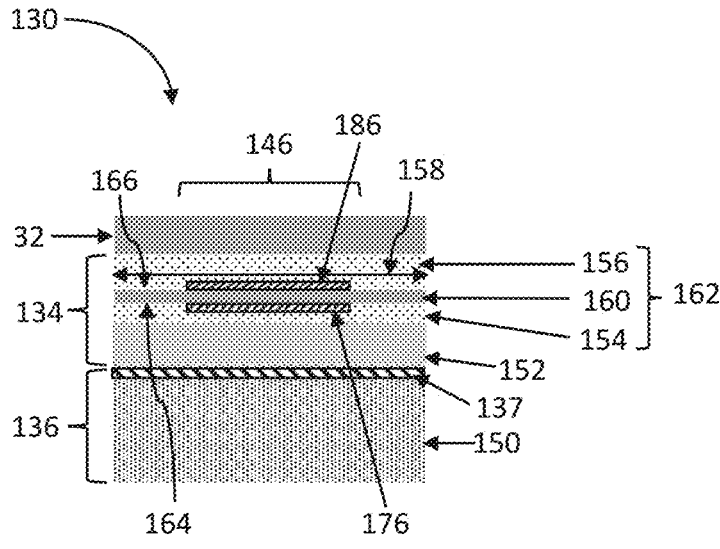
FIG. 3 is a schematic cross-sectional view of a piezoelectric micromechanical force-measuring element (PMFE) of the force-measuring device of FIG. 2.

FIG. 3 is a schematic cross-sectional view of a portion 130 of the force-measuring device 20 of FIG. 2. The semiconductor die 28 includes a MEMS portion 134 and an ASIC portion 136 underneath the PMFE 146. Also shown is an encapsulating adhesive 32 that is above the PMFE 146. Comparing the ASIC portion 136 and the MEMS portion 134, the MEMS portion 134 is closer to the top surface 26 and the ASIC portion 136 is closer to the electrical interconnection surface 24. The ASIC portion 136 consists of a semiconductor substrate 150 and signal processor 137 thereon or therein. Typically, the semiconductor substrate is a silicon substrate, but other semiconductor substrates such as silicon-on-insulator (SOI) substrates can also be used.

The MEMS portion 134 includes a PMFE 146. The MEMS portion 134 includes a thin-film piezoelectric stack 162 overlying the semiconductor substrate 150. The thin-film piezoelectric stack 162 includes a piezoelectric layer 160, which is a layer exhibiting the piezoelectric effect. Suitable materials for the piezoelectric layer 160 are aluminum nitride, scandium-doped aluminum nitride, polyvinylidene fluoride (PVDF), lead zirconate titanate (PZT), $K_xNa_{1-x}NbO_3$ (KNN), quartz, zinc oxide, lithium niobate, and $Bi_{0.5}Na_{0.5}TiO_3$ (BNT), for example. For example, the piezoelectric layer is a layer of aluminum nitride having a thickness of approximately 1 μm. The piezoelectric layer 160 has a top major surface 166 and a bottom major surface 164 opposite the top major surface 166. In the example shown, the thin-film piezoelectric stack 162 additionally includes a top mechanical layer 156, attached to or adjacent to (coupled to) top major surface 166, and a bottom mechanical layer 154, attached to or adjacent to (coupled to) bottom major surface 164. In the example shown, the thickness of the top mechanical layer 156 is greater than the thickness of the bottom mechanical layer 154. In other examples, the thickness of the top mechanical layer 156 can be smaller than the thickness of the bottom mechanical layer 154. Suitable materials for the mechanical layer(s) are silicon, silicon oxide, silicon nitride, and aluminum nitride, for example. Suitable materials for the mechanical layer(s) can also be a material that is included in the piezoelectric layer 160, which in this case is aluminum nitride. In the example shown, the top mechanical layer and the bottom mechanical layer contain the same material. In other examples, the top mechanical layer and the bottom mechanical layer are of different materials. In other examples, the top mechanical layer or the bottom mechanical layer can be omitted. The mechanical layer(s) adjust the mechanical properties of the thin-film piezoelectric stack 162. When coupled to the cover layer, the force-measuring device 20 is preferably oriented such that the piezoelectric layer 160 faces toward the cover layer 120. For example, the force-measuring device 20 is oriented such that the piezoelectric layer 160 and the cover layer 120 are approximately parallel.

For ease of discussion, only one PMFEs is shown in FIG. 3. However, a typical force-measuring device may contain multiple PMFEs. The PMFEs are located at respective lateral positions along the thin-film piezoelectric stack 162. An insulating support layer 152 supports the thin-film piezoelectric stack. Suitable materials for the support layer 152 are silicon, silicon nitride, and silicon oxide, for example. Suitable materials for the support layer 152 can also be a material that is included in the piezoelectric layer 160, which in this case is aluminum nitride.

Each PMFE 146 includes a respective portion of the thin-film piezoelectric stack 162. Each PMFE 146 includes a first PMFE electrode 176 positioned on a first side (bottom surface) 164 of the piezoelectric layer 160 and a second PMFE electrode 186 positioned on a second side (top surface) 166 opposite the first side. The first PMFE electrode 176 and the second PMFE electrode 186 are positioned on opposite sides of the piezoelectric layer 160. In each PMFE 146, the first PMFE electrode 176, the second PMFE electrode 186, and the portion of the piezoelectric layer 160 between them constitute a piezoelectric capacitor. The PMFEs are coupled to the signal processor 137 as explained in detail hereinbelow.

Figure 4:
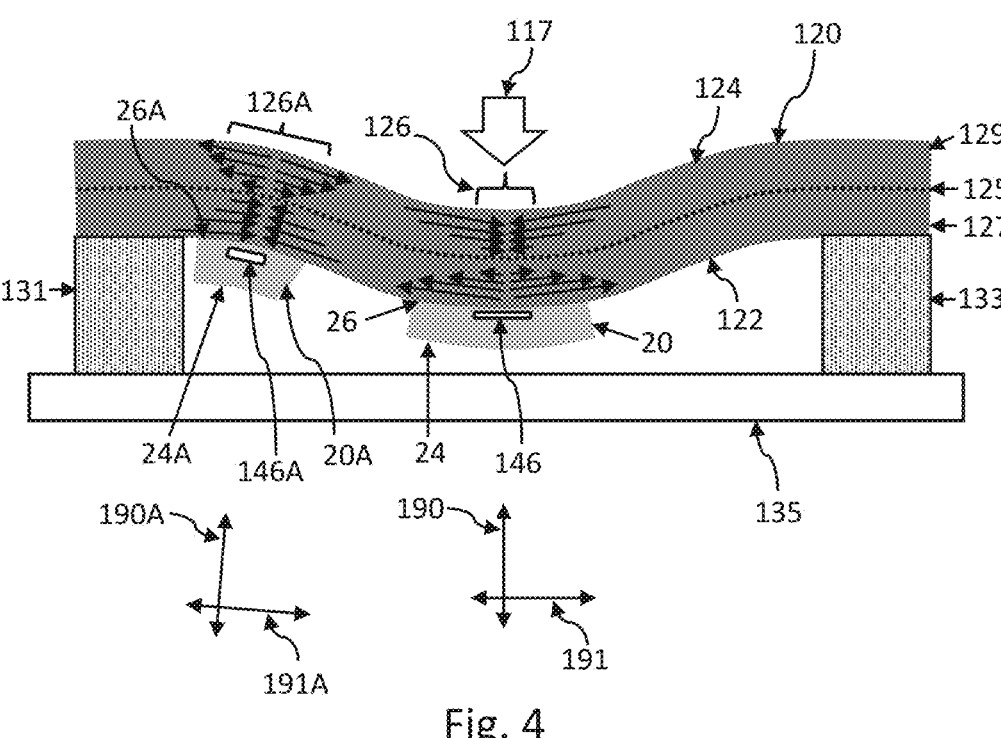
FIG. 4 is a schematic side view of force-measuring device(s) and a cover layer, attached to each other and undergoing deformation.

FIG. 3 shows the PMFE in a quiescent state, in which there is no flexing of the piezoelectric stack 162. In the quiescent state, there is no voltage generated between the PMFE electrodes (176, 186). FIG. 4 is a schematic side view of a force-measuring device 20 and a cover layer 120 attached to or adhered to (coupled to) each other. A top surface 26 of force-measuring device 20 is coupled to inner surface 122 of the cover layer 120. Force-measuring device 20 and cover layer 120 overlie a rigid substrate 135. For ease of viewing, other components of system 100 (e.g., flexible circuit 108, ICs 114) have been omitted. Force-measuring device 20 includes PMFEs 146. In the example shown, two anchor posts 131, 133 fix the two ends of the cover layer 120 to the substrate 135.

In the example of FIG. 4, force-measuring device 20 is not anchored to the rigid substrate 135 and can move with the cover layer 120 when the cover layer 120 is deflected upwards or downwards. A downward force 117, shown as a downward arrow, is applied by a finger (or another object) pressing against the outer surface 124 of the cover layer 120 at the force-imparting point 126 for example. A finger pressing against or tapping the outer surface 124 are examples of touch excitation, or more generally, excitation. In the example shown in FIG. 4, the cover layer 120 is deflected in a first direction (e.g., downwards) in response to a touch excitation at the force-imparting point 126. Force-measuring device 20 is located approximately half-way between the anchor posts 131, 133 and force-imparting point 126 overlaps force-measuring device 20. A neutral axis 125 is located within the cover layer 120. A lower portion 127 of the cover layer 120, below the neutral axis 125, is under tensile (positive) strain at the force-imparting point 126, represented by outward pointing arrows, primarily along lateral direction 191, perpendicular to the normal direction 190. Normal direction 190 is normal to the piezoelectric layer 160. Normal direction 190 is approximately normal to a plane of the respective piezoelectric capacitor. The piezoelectric layer 160 has a built-in polarization (piezoelectric polarization) that is approximately parallel to normal direction 190. The lateral direction 191 is approximately parallel to the piezoelectric layer 160 at the respective location of the piezoelectric layer 160 (at region 126). An upper portion 129 of the cover layer 120, above the neutral axis 125, is under compressive (negative) strain at the force-imparting point 126, represented by inward pointing arrows, primarily along lateral direction 191. Since force-measuring device 20 is coupled to the lower portion 127 at the force-imparting point 126, the PMFEs 146 are also under tensile (positive) strain. Typically, the entire force-measuring device 20 may be deflected under the applied downward force 117. In the example shown in FIG. 4, the PMFEs 146 are under a positive strain, and the respective portions of the piezoelectric layer 160 at the PMFEs 146 undergo expansion along a lateral direction 191. As a result, an electrical charge is generated at each PMFE (146) between the respective PMFE electrodes (176, 186). This electrical charge is detectable as a first deflection voltage $V_{d1}$ (corresponding to strain of a certain polarity and magnitude). The polarity of the first deflection voltage $V_{d1}$ at a PMFE depends upon the polarity of the strain (positive strain (tensile) or negative strain (compressive)) at the respective portion of the piezoelectric layer between the respective PMFE electrodes of the PMFE. The magnitude of the first deflection voltage $V_{d1}$ at a PMFE depends upon the magnitude of the strain at the respective portion of the piezoelectric layer between the respective PMFE electrodes of the PMFE. Subsequently, when the downward force 117 is no longer applied to the force-imparting point 126, the cover layer 120 deflects in a second direction opposite the first direction (e.g., upwards). This is detectable as a second deflection voltage $V_{d2}$ (corresponding to strain of a certain polarity and magnitude). The polarity of the second deflection voltage $V_{d2}$ at a PMFE depends upon the polarity of the strain at the respective portion of the piezoelectric layer between the respective PMFE electrodes of the PMFE. The magnitude of the second deflection voltage $V_{d2}$ at a PMFE depends upon the magnitude of the strain at the respective portion of the piezoelectric layer between the respective PMFE electrodes of the PMFE.

FIG. 4 shows a second force-measuring device 20A, including PMFEs 146A. A top surface 26A of force-measuring device 20A is coupled to inner surface 122 of the cover layer 120. Force-measuring device 20A overlies the rigid substrate 135 and is located at a second region 126A, between anchor post 131 and first force-measuring device 20. Note that force-measuring device 20A is laterally displaced from the location where the downward force 117 is applied to the outer surface 124 (at force-imparting point 126). The lower portion 127 of the cover layer 120 is under compressive (negative) strain at the second region 126A, represented by inward pointing arrows, primarily along the lateral direction 191A, perpendicular to the normal direction 190A. The lateral direction 191A is approximately parallel to the piezoelectric layer 160 at the respective location of the piezoelectric layer 160 (at second region 126A). The upper portion 129 of the cover layer 120 is under tensile (positive) strain at the second region 126A, represented by outward pointing arrows, primarily along the lateral direction 191A. Since force-measuring device 20A is coupled to the inner surface 122, adjacent to the lower portion 127, the PMFEs 146A are also under compressive (negative) strain. These examples illustrate that when the cover layer and the force-measuring devices undergo deflection in response to a touch excitation at the outer surface, expansion and/or compression of the piezoelectric layer may be induced by the deflection of the cover layer.

In operation, PMFE 146 is configured to output voltage signals between the PMFE electrodes (176, 186) in accordance with a time-varying strain at the respective portion of the piezoelectric layer between the PMFE electrodes (176, 186) resulting from a low-frequency mechanical deformation. The low-frequency mechanical deformation can be caused by a finger pressing against or tapping at outer surface of the cover layer 120, to which the force-measuring device 20 is attached (coupled). The PMFE 146 is coupled to the signal processor 137. The signal processor is configured to read at least some of the PMFE voltage signals. By amplifying and processing the voltage signals from the PMFE at the signal processor, the strain that results from mechanical deformation of the piezoelectric layer can be measured.

Figure 9:
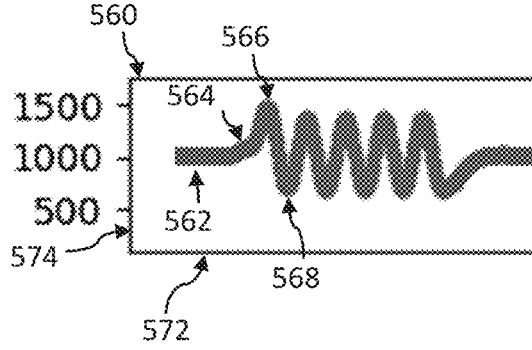
FIGS. 9 and 10 are graphical plots of force data obtained from one of the force-measuring devices in response to forces imparted at respective force-imparting points.
Figure 10:
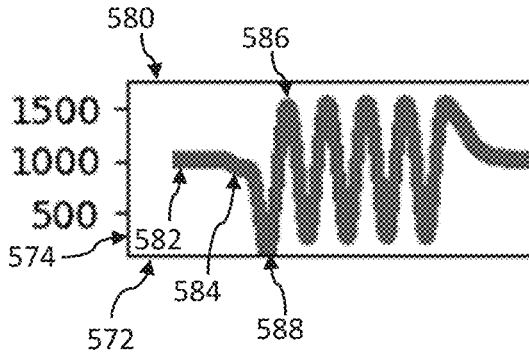

Typically, the low-frequency deformation is induced by touch excitation which is not repetitive or is repetitive having a repetition rate of 100 Hz or less, or 10 Hz or less. These repetition rates correspond to the repetition rates of a repetitive touch excitation, e.g., a finger repeatedly pressing against or tapping at a force-imparting point. Illustrative force data measured during a repetitive touch event (finger touching and pressing the cover layer repeatedly) is shown in FIGS. 9 and 10.

Figure 5:
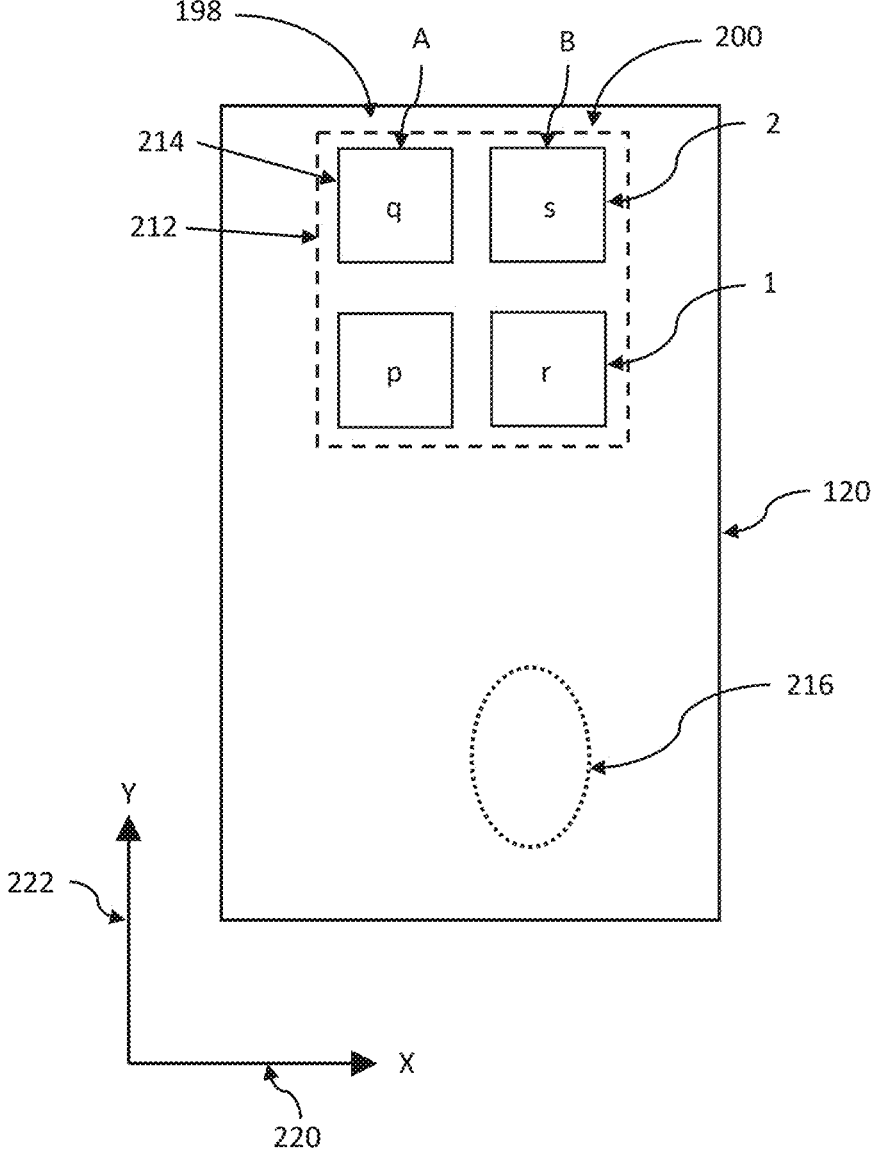
FIG. 5 is a schematic top view of a PMFE array of a force-measuring device.

A force-measuring device may contain multiple PMFEs. FIG. 5 is a top view of an example MEMS portion 200 of a force-measuring device 198. The MEMS portion 200 includes four PMFEs (214, locations identified as p, q, r, and s) arranged in a two-dimensional array 212 extending along the X-axis (220) and Y-axis (222). The PMFEs are arranged in columns (A and B) and rows (1 and 2). In the example shown, the two-dimensional PMFE array 212 has a square outer perimeter, but in other examples the outer perimeter can have other shapes such as a rectangle. The force-measuring device is coupled to a cover layer 120. The cover layer 120 is shown overlying the PMFEs 214. Each PMFE measures the strain (force) at a respective X and Y location. For example, the PMFE 214 at location q measures the strain at the piezoelectric layer between the electrodes of that PMFE. Therefore, the PMFE array 212 achieves a two-dimensional positional resolution of strain (force) measurement. The force-imparting point can be any point on the cover layer, such as the PMFE's locations p, q, r, or s, or a point laterally displaced from the PMFEs 214, such as location 216. Suppose that we wish to set up a virtual button approximately corresponding to the PMFE array region 212. In this case, we would configure the PMFEs and the cover layer such that PMFE signals measured from a typical touch excitation at locations outside the PMFE array region (e.g., location 216) would be below a predetermined threshold. On the other hand, suppose that we wish to set up a virtual button approximately corresponding to the entire cover layer region 120. In this case, we would configure the PMFEs and the cover layer such that force data arising from a typical touch excitation any location within the cover layer region 120 would be above a predetermined threshold.

Figure 6:
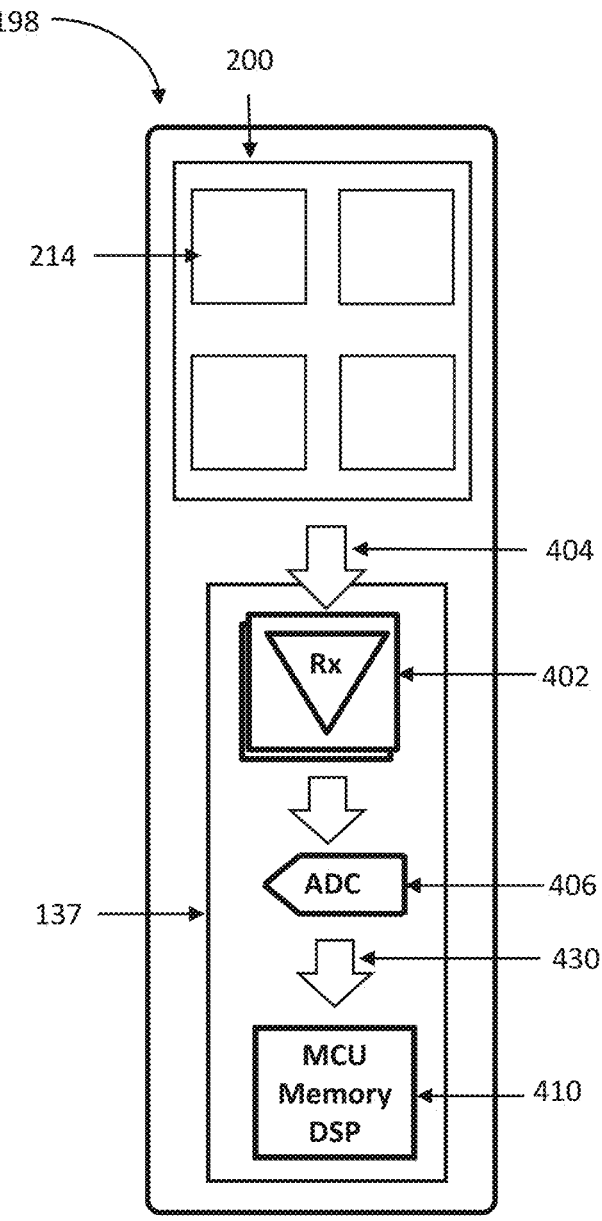
FIG. 6 is an electronics block diagram of a force-measuring device.

FIG. 6 is an electronics block diagram of the force-measuring device 198, including a MEMS portion 200 and signal processor 137. The MEMS portion includes PMFEs 214. Signal processor 137 includes amplifiers (402) and analog-to-digital converters (ADCs) (406). Voltage signals read from PMFEs 214 reach amplifiers 402 via electrical interconnections 404 and get amplified by the amplifiers 402. These amplified voltage signals are sent to ADC 406 to be converted to force data (digital transducer data) 430 which can be processed or stored by other circuit blocks 410. The other circuit blocks 410 could be microcontrollers (MCUs), memories, and digital signal processors (DSPs), for example. Force-measuring device 198 can be implemented as a semiconductor die including ASIC and MEMS portions (e.g., force-measuring device 20 of FIG. 2) or as an assembly of semiconductor and MEMS chips.

Figures 7, 8:
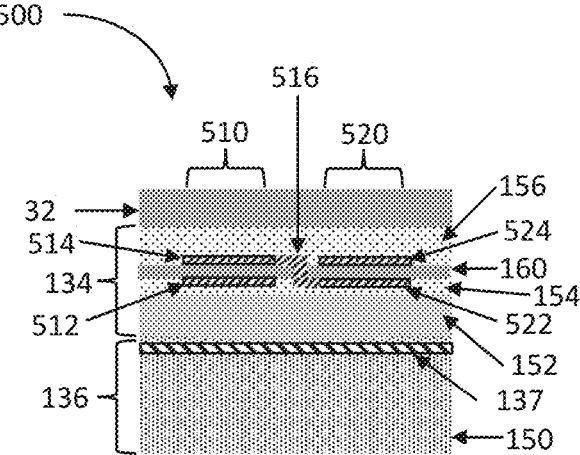
FIG. 7 is a schematic cross-sectional view of a set (pair) of PMFEs.
FIG. 8 is a block diagram illustrating the electrical connections of the PMFE pair of FIG. 7 to related signal processor.

FIG. 7 is a schematic cross-sectional view of a set 500 of PMFEs 510 and 520. Also shown is the ASIC portion 136 that is under the PMFEs 510, 520 and the encapsulating adhesive 32 that is above the PMFEs 510 and 520. FIG. 7 shows the PMFE in a quiescent state analogous to the quiescent state described with reference to FIG. 3. A PMFE has been described with reference to FIG. 3. In the example shown (FIG. 7), the piezoelectric stack includes a piezoelectric layer 160, a top mechanical layer 156, and a bottom mechanical layer 154. In a deformed state (such as shown in FIG. 4), an electrical charge is generated between the PMFE electrodes 512 and 514 of first PMFE 510 and between the PMFE electrodes 522 and 524 of the second PMFE 520.

For each PMFE (510, 520), the first PMFE electrode (512, 522), the second PMFE electrode (514, 524), and the respective portion of the piezoelectric layer 160 between them constitute a piezoelectric capacitor. FIG. 8 is a block diagram illustrating the electrical connections of the PMFE set (pair) to certain portions of the signal processor 137. In FIG. 8, we show each PMFE (510, 520) as a piezoelectric capacitor. PMFEs 510 and 520 are connected in series via a wire 516 that includes a via that penetrates the piezoelectric layer 160 (FIG. 7). Wire 516 connects second electrode (top electrode) 514 of first PMFE 510 to the first electrode (bottom electrode) 522 of the second PMFE 512. The outermost electrodes of the PMFE electrodes in the series 502 are first electrode 512 of the first PMFE 510 and the second electrode 524 of the second PMFE 520. These outermost electrodes of the PMFE electrodes in the series 502 are connected as differential inputs 551, 552 to the amplifier circuitry 402 of the signal processor 137. The voltage signals at inputs 551, 552 are amplified by the amplifier circuitry 402. Amplified voltage signals 420 are output from the amplifier circuitry 402 to the analog-to-digital converter (ADC) 406. Force data (digital transducer data) 430 are output from the ADC 406.

As shown in the example of FIG. 7, wire 516 is tied to a common node 518. In this case, we can refer to the node between the two adjacent PMFEs 510, 520 connected in series as a common node. If the voltage of the common node is held at 0 V, the voltage signal input to input 551 can be expressed as $-\Delta V_1$, and the voltage signal input to input 552 can be expressed as $\Delta V_2$, where the subscripts refer to the first PMFE (510) or second PMFE (520). An advantage of a node between adjacent PMFEs connected in series being a common node is that voltage offsets from the common node voltage are reduced, simplifying subsequent amplification of low-voltage signals.

FIGS. 9 and 10 show some examples of force data (digital transducer data). FIG. 9 is graphical plot 560 of force data (digital transducer data) obtained from a force-measuring device in response to a time-varying applied force imparted at a force-imparting point. For example, this force data corresponds to digital signals 430 output from the ADC 406 (FIGS. 6 and 8). For example, the force-imparting point is overlapped with the force-measuring device. The time-varying applied force consists of repetitively pressing at the force-imparting point five times. Plot 560 has a horizontal axis 572 which shows time t and a vertical axis 574 which shows force data (digital transducer data). For example, a time duration of plot 560 is 10 seconds. Before the application of the time-varying applied force, the PMFEs are in a quiescent state (plot section 562). For example, the PMFE might be in a quiescent state if there is no deformation of the cover layer. As the time-varying applied force begins, the digital transducer data show a positive slope (plot section 564) and then reaches a maximum 566, corresponding to strain of a first polarity at the PMFEs. This corresponds to the PMFEs under tension (see PMFE 146 in FIG. 4). As the pressure at the force-imparting point is released, the digital transducer data decreases from a maximum 566 to a minimum 568. Local maxima are reached five times, corresponding to repetitively pressing against the force-imparting point five times. A characteristic amplitude of the digital transducer data can be defined to be a difference between a local maximum 566 and a local minimum 568. Alternatively, a characteristic amplitude of the digital transducer data can be defined to be a difference between a global maximum and a global minimum, within a predetermined time window such as shown in FIG. 9.

FIG. 10 is graphical plot 580 of force data (digital transducer data) obtained from a force-measuring device in response to a time-varying applied force (identical to that for FIG. 9) imparted at a force-imparting point. For example, this force-imparting point is different from the force-imparting point of FIG. 9. This force-imparting point can be laterally displaced from and remote from the force-measuring device. For example, a time duration of plot 580 is 10 seconds. Before the application of the time-varying applied force, the PMFEs are in a quiescent state (plot section 582). As the time-varying applied force begins, the digital transducer data show a negative slope (plot section 584) and then reaches a local minimum 588, corresponding to strain of a second polarity at the PMFEs. This corresponds to the PMFEs under compression (see PMFE 146A in FIG. 4). As the pressure at the force-imparting point is released, the digital transducer data increases from a local minimum 588 to a local maximum 586. Local minima are reached five times, corresponding repetitively pressing against the force-imparting point five times. A characteristic amplitude of the digital transducer data can be defined to be a difference between the local maximum 586 and the local minimum 588. Alternatively, a characteristic amplitude of the digital transducer data can be defined to be a difference between a global maximum and a global minimum, within a predetermined time window such as shown in FIG. 10.

Figure 11:
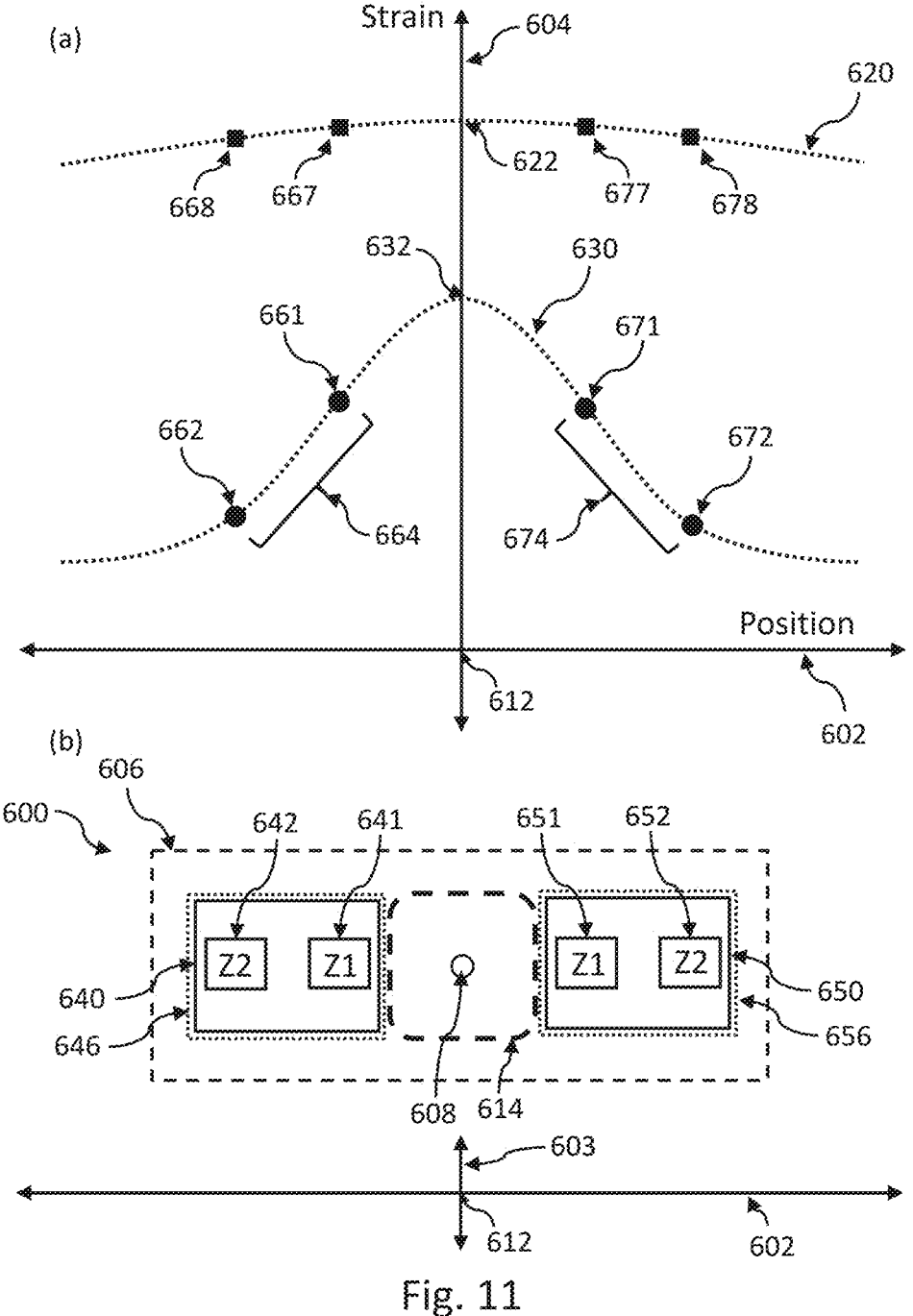
FIG. 11 is a graphical plot of PMFE force data and a schematic plan view of a user-input system.

FIG. 11 includes a graphical plot section (a) and a schematic plan view section (b). Section (a) shows graphical plots 620 and 630. Section (b) shows a schematic plan view of a user-input system 600, laid out along an X-axis 602 and a Y-axis 603. User-input system 600 includes a cover layer 606 and force-measuring devices 640, 650. Each force-measuring device (640, 650) is coupled to the inner surface of the cover layer at a respective contact region (646, 656) and arranged such that the force-measuring devices 640, 650 are separated from each other along a longitudinal axis (X-axis) 602. In the example shown, each force-measuring device includes two piezoelectric micromechanical force-measuring elements (PMFEs). Force-measuring device 640 includes PMFEs 641 and 642. Force-measuring device 650 includes PMFEs 651 and 652.

Suppose that a finger presses against the cover layer at force-imparting point 608, approximately half-way between the force-measuring devices 640, 650. In the example shown, the force-imparting point 608 is also a center point of a virtual button 614, shown positioned between the force-measuring devices 640, 650. We take a lateral position (X-axis position) of point 608 as an origin (612) of the X-axis 602. The finger-press causes a mechanical deformation of the cover layer, which is transmitted to the PMFEs. This is referred to as a pressure-induced deformation of the PMFE. In addition, the finger-press likely causes the temperature of the cover layer in a region around the force-imparting point to increase. For example, the finger might have a temperature of approximately 37° C. and the user-input system might be at a temperature of approximately 20° C. Conduction of heat to a PMFE results in a temperature-induced deformation of the PMFE. Accordingly, the time-varying strain at a PMFE includes a pressure-induced component and a temperature-induced component.

Plot 620 represents a temperature-induced component of a strain at a PMFE, as a function of a position of the PMFE along the X-axis. Plot 630 represents a pressure-induced component of a strain at a PMFE, as a function of a position of the PMFE along the X-axis. Temperature-induced strain component 620 peaks at point 622, corresponding to the X-axis position of the force-imparting point 608. Pressure-induced strain component 630 peaks at data point 632, corresponding to the X-axis position of the force-imparting point 608. Compared to the pressure-induced strain component 630, the temperature-induced strain component 620 has a grater magnitude and is a more slowly varying function of X-position. There is a possibility for the pressure-induced component to be obscured by the temperature-induced component.

To detect a user input reliably and accurately, it would be preferable to reduce a contribution to the PMFE data from the temperature-induced component. The pressure-induced component plot 630 exhibits greater variation as a function of X-axis position in plot regions 664 and 674 near respective inflection points where the curvature of the plot 630 changes sign. The regions of greater PMFE data variation 664, 674 are laterally displaced (displaced along X-axis) from peak 632. Region 664 (located to the left of the peak data point 632) includes data points 661 and 662. Region 674 (located to the right of the peak data point 632) includes data points 671 and 672. The first force-measuring device 640 is positioned to the left of the center point 608, such that the first PMFE 641 corresponds to data point 661 and second PMFE 642 corresponds to data point 662. The second force-measuring device 650 is positioned to the right of the center point 608, such that the first PMFE 651 corresponds to data point 671 and second PMFE 652 corresponds to data point 672.

The temperature-induced component plot 620 includes data points 667, 668 to the left of the peak data point 622 and data points 677, 678 to the right of the peak data point 622. The first force-measuring device 640 is positioned to the left of the center point 608, such that the first PMFE 641 corresponds to data point 667 and second PMFE 642 corresponds to data point 668. The first PMFE 641 and the second PMFE 642 are at different distances from the center point 608. The second force-measuring device 650 is positioned to the right of the center point 608, such that the first PMFE 651 corresponds to data point 677 and second PMFE 652 corresponds to data point 678. The first PMFE 651 and the second PMFE 652 are at different distances from the center point 608.

At the first force-measuring device 640, the strain data Z1 represents PMFE voltage signals from the first PMFE 641 and are obtained from the first PMFE 641. The strain data Z2 represents PMFE voltage signals from the second PMFE 642 and are obtained from the second PMFE 642. Z1 can be written as a sum of the 661 and 667 data points, and Z2 can be written as a sum of the 662 and 668 data points. However, the temperature-induced component is a slowly varying function of X-position and can be approximated as a constant value (along X-axis 602, at a certain point in time). Accordingly, for the first force-measuring device 640, a difference between Z1 and Z2 can be approximated as:

$$Z1-Z2 \cong Z(661)-Z(662) \quad \text{(Equation 1)}$$

Similarly, for the for the first force-measuring device 650, a difference between Z1 and Z2 can be approximated as:

$$Z1-Z2 \cong Z(671)-Z(672) \quad \text{(Equation 2)}$$

By calculating a difference between Z1 and Z2, the contribution of the temperature-induced component to the PMFE data is reduced. In the example shown, the locations of the first and second PMFEs are chosen to increase a magnitude of the difference between their PMFE data. The difference Z1–Z2 is an example of a force-trend data is obtained from the PMFE voltage signals. One can assess a user input in accordance with the force-trend data. In this example, one can assess the user input by comparing a magnitude of the difference Z1–Z2 to a predetermined threshold. For example, one can determine that there has been a "real" user input (e.g., a finger press at the virtual button) when the magnitude of the difference Z1–Z2 is greater than a predetermined threshold. Concurrently, one can determine that there has not been a "real" user input when the magnitude of the difference Z1–Z2 is smaller than the predetermined threshold. An example of an input that is not a "real" user input is a finger press on a region remote from the virtual button. As another example, one can consider another predetermined threshold above which it is likely that there has been an impact that does not correspond to a "real" user input. In the case of a virtual button on a smartphone device, this may correspond to an impact resulting from a person stepping on or sitting on the smartphone. One can determine that there has been a user input if the force-trend data satisfy at least one user-input condition. An example of a user-input condition can be that a magnitude of the difference is greater than a predetermined threshold. A reliability of detecting user input at a virtual button 614 can be improved by using force-trend data from two force-measuring devices 640, 650.

Figure 12:
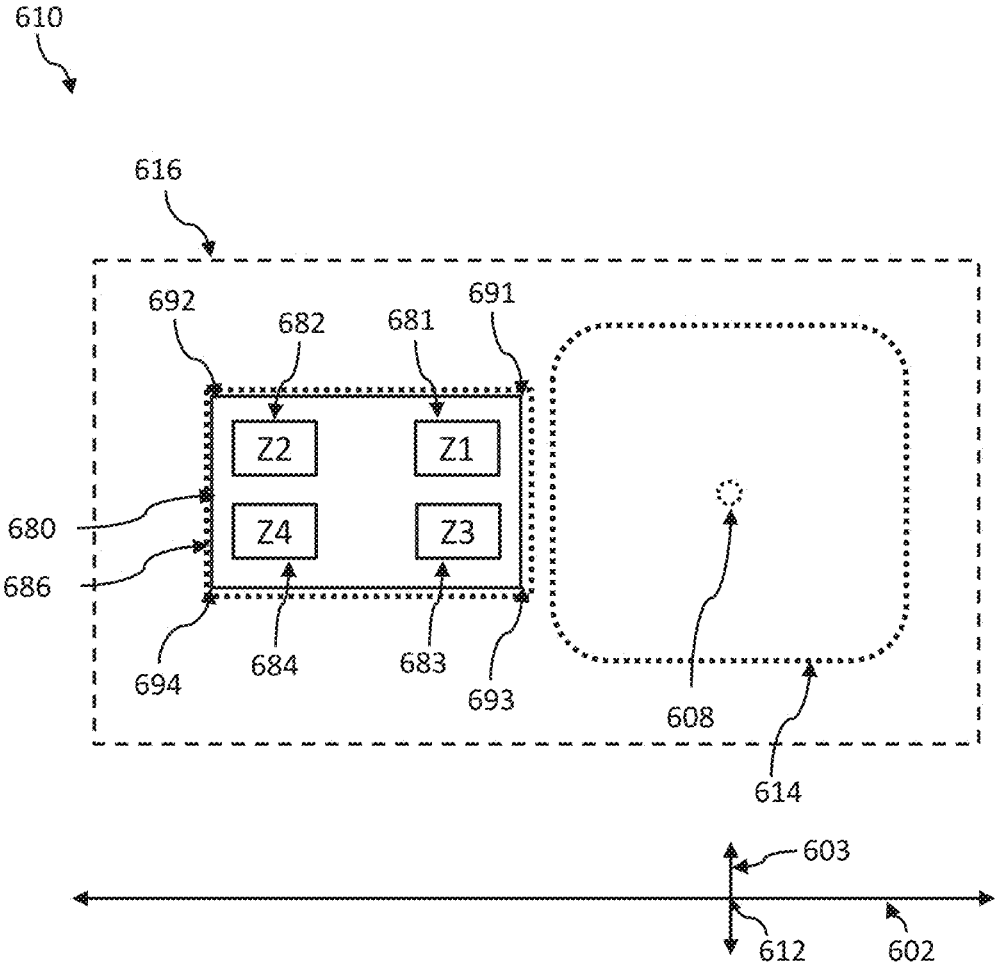
FIG. 12 is a schematic plan view of a layout of a user-input system including one force-measuring device.

FIG. 12 shows a schematic plan view of a user-input system 610. User-input system 610 includes a cover layer 616 and a force-measuring device 680. The force-measuring device (680) is coupled to the inner surface of the cover layer 616 at a contact region (686) and displaced to the left of the center point 608 along a longitudinal axis (X-axis) 602. Force-measuring device 680 includes four PMFEs: PMFEs 681, 682, 683, and 684. In the example shown, the first PMFE 681 is near a first proximal corner 691 of the force-measuring device 680 as seen from the center point 608, the second PMFE 682 is near a first distal corner 692 of the force-measuring device 680 as seen from the center point 608, the third PMFE 683 is near the second proximal corner 693 of the force-measuring device 680 as seen from the center point 608, and the fourth PMFE 684 is near the second distal corner 694 of the force-measuring device 680 as seen from the center point 608. The first distal corner 692 is adjacent to the first proximal corner 691 (there are no other corners between them). The second proximal corner 693 is adjacent to the first proximal corner 691. The second distal corner 694 is adjacent to the first distal corner 692 and the second proximal corner 693.

At the force-measuring device 680, strain data Z1 represents PMFE voltage signals from the first PMFE 681 and is obtained from the first PMFE 681, strain data Z2 represents PMFE voltage signals from the second PMFE 682 and is obtained from the second PMFE 682, strain data Z3 represents PMFE voltage signals from the third PMFE 683 and is obtained from the third PMFE 683, and strain data Z4 represents PMFE voltage signals from the fourth PMFE 684 and is obtained from the fourth PMFE 684. Examples of force-trend data that can be calculated from Z1, Z2, Z3, and Z4 are tabulated in Table 1 hereinbelow.

Table 1 lists different quantities that can be calculated from Z1, Z2, Z3, and Z4. A longitudinal sum (ID No. 1 or 2) represents an average of the strain of two PMFE arrayed along the X-axis. A transverse sum (ID No. 4 or 5) represents an average of the strain of two PMFE arrayed along the Y-axis. A Y-difference (ID No. 3) is a difference between the first longitudinal sum (ID No. 1) and the second longitudinal sum (ID No. 2). Accordingly, the Y-difference represents a gradient along the Y-axis 603 of the average strain (strain averaged over the X-axis 602). An X-difference (ID No. 6) is a difference between the proximal transverse sum (ID No. 4) and the distal transverse sum (ID No. 5). Accordingly, the X-difference represents a gradient along the X-axis 602 of the average strain (strain averaged over the Y-axis 603). A first example of assessing the user input in accordance with the force-trend data is as follows: comparing a magnitude of the Y-difference (ID No. 3) to a first predetermined threshold (e.g., determining that there is user input if the magnitude of the Y-difference is less than (or greater than) the first predetermined threshold). A second example of assessing the user input in accordance with the force-trend data is as follows: comparing a magnitude of the X-difference (ID No. 6) to a second predetermined threshold (e.g., determining that there is user input if the magnitude of the X-difference is greater than (or less than) the second predetermined threshold). For example, it is determined that there has been a user input if either one of these conditions is satisfied or both conditions are satisfied.

TABLE 1

| ID No. | Short Descriptive Name | Quantity |
|---|---|---|
| 1 | First longitudinal sum | Z1 + Z2 |
| 2 | Second longitudinal sum | Z3 + Z4 |
| 3 | Y-difference | (Z1 + Z2) – (Z3 + Z4) or (Z3 + Z4) – (Z1 + Z2) |
| 4 | Proximal transverse sum | Z1 + Z3 |
| 5 | Distal transverse sum | Z2 + Z4 |
| 6 | X-difference | (Z1 + Z3) – (Z2 + Z4) or (Z2 + Z4) – (Z1 + Z3) |
| 7 | Total sum | Z1 + Z2 + Z3 + Z4 |
| 8 | First longitudinal difference | Z1 – Z2 or Z2 – Z1 |
| 9 | Second longitudinal difference | Z3 – Z4 or Z4 – Z3 |
| 10 | Proximal transverse difference | Z1 – Z3 or Z3 – Z1 |
| 11 | Distal transverse difference | Z2 – Z4 or Z4 – Z1 |
| 12 | First diagonal difference | Z1 – Z4 or Z4 – Z1 |
| 13 | Second diagonal difference | Z3 – Z2 or Z2 – Z3 |

Figure 13:
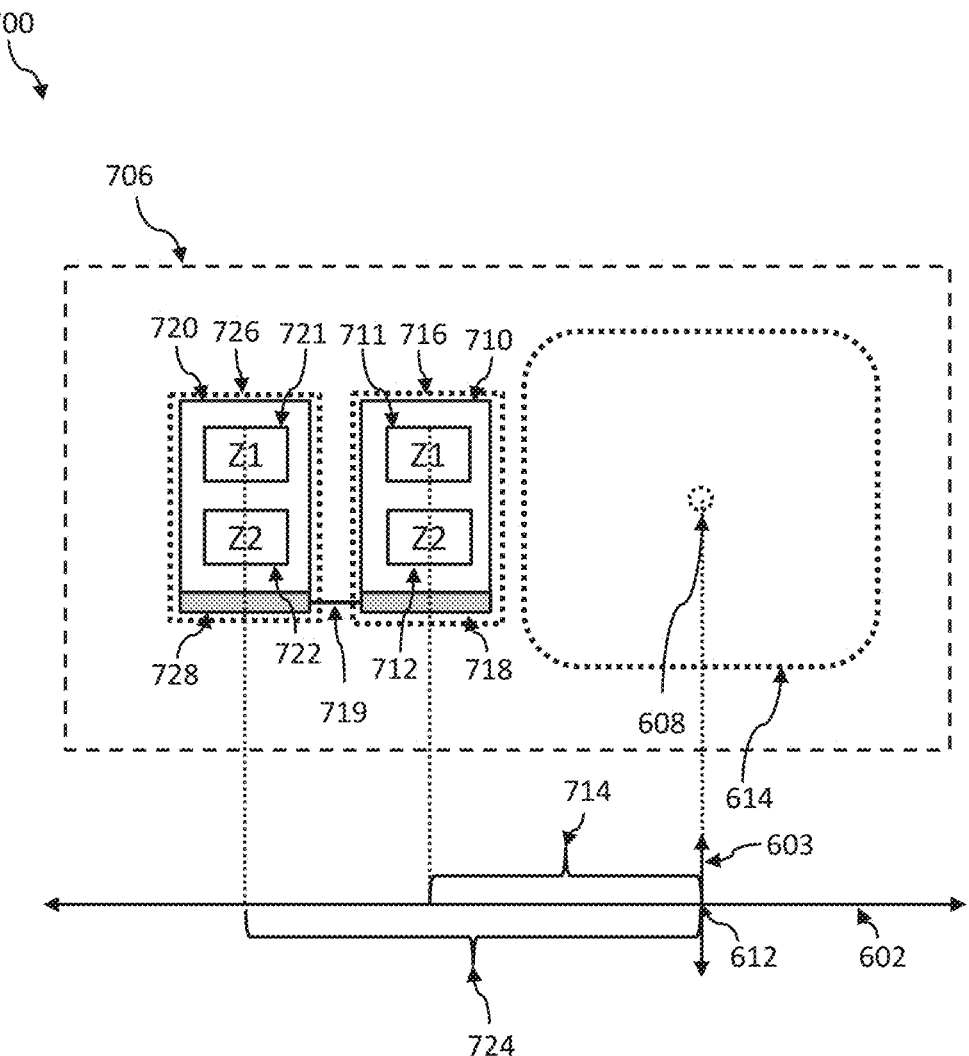
FIG. 13 is a schematic plan view of a layout of a user-input system including two force-measuring devices.

FIG. 13 shows a schematic plan view of a user-input system 700. User-input system 700 includes a cover layer 706 and force-measuring devices 710, 720. Each force-measuring device (710, 720) is coupled to the inner surface of the cover layer 706 at a respective contact region (716, 726) and displaced to the left of the center point 608 along a longitudinal axis (X-axis) 602. The force-measuring devices are arranged such that force-measuring device 720 is further away from the center point 608 (along X-axis 602) than is the force-measuring device 710. In the example shown, each force-measuring device includes two piezoelectric micromechanical force-measuring elements (PMFEs). Force-measuring device 710 includes PMFEs 711 and 712. Force-measuring device 720 includes PMFEs 721 and 722. The first PMFE 711 and the second PMFE 712 of the first force-measuring device 710 are, on average, at a first distance 714 from center point 608 (along the X-axis 602). The first PMFE 721 and the second PMFE 722 of the second force-measuring device 720 are, on average, at a second distance 724 from center point 608 (along the X-axis 602). The first distance 714 and the second distance 724 are different. In this case, the second distance 724 is greater than the first distance.

At the force-measuring device 710, strain data Z1 represents PMFE voltage signals from the first PMFE 711 and is obtained from the first PMFE 711, strain data Z2 represents PMFE voltage signals from the second PMFE 712 and is obtained from the second PMFE 712. At the force-measuring device 720, strain data Z1 represents PMFE voltage signals from the first PMFE 721 and is obtained from the first PMFE 721, strain data Z2 represents PMFE voltage signals from the second PMFE 722 and is obtained from the second PMFE 722. In the example shown, a total sum of each force measuring device (710 or 720) is defined as Z1+Z2. For each force-measuring device (710, 720), the total sum represents an average of the strain at the PMFEs of the respective force-measuring device.

Each force-measuring device (710, 720) includes a respective signal processor (718, 728). Signal processors 718 and 728 are connected to each other via a bus wiring 719. Each of the PMFEs (711, 712) of the first force-measuring device 710 is configured to output voltage signals to the signal processor 718 in accordance with a time-varying strain at the respective PMFE. Each of the PMFEs (721, 722) of the second force-measuring device 720 is configured to output voltage signals to the signal processor 728 in accordance with a time-varying strain at the respective PMFE. An example of force-trend data that can be calculated is a difference between the total sums Z1+Z2 of the first and second force-measuring devices. Such force-trend data would represent a gradient along the X-axis 602 of the average strain (strain averaged over the Y-axis 603). For example, signal processor 718 can be configured to: (1) obtain Z1 from the voltage signals of PMFE 711, (2) obtain Z2 from the voltage signals of PMFE 712, (3) calculate a sum Z1+Z2 for the first force-measuring device 710 (first FMD sum), and (4) transmit the first FMD sum to signal processor 728 via bus wiring 719. For example, signal processor 728 can be configured to: (1) obtain Z1 from the voltage signals of PMFE 721, (2) obtain Z2 from the voltage signals of PMFE 722, (3) calculate a sum Z1+Z2 for the second force-measuring device 720 (second FMD sum), and (4) receive the second FMD sum from signal processor 718 via bus wiring 719, and (5) calculate a difference between the first and second FMD sums. Signal processor 718 calculates (obtains) some of the force-trend data (first FMD sum) and signal processor 728 calculates (obtains) some of the force-trend data (second FMD sum and difference between the first and second FMD sums). Either signal processor (718 or 728) can be configured to calculate the force-trend data. Additionally, signal processor 728 is configured to assess a user input (e.g., to determine that there has been a "real" user input or to determine that there has not been a user input) at the virtual button 614 in accordance with the force-trend data for the force-measuring devices (710, 720) corresponding to the virtual button 614.

Figure 14:
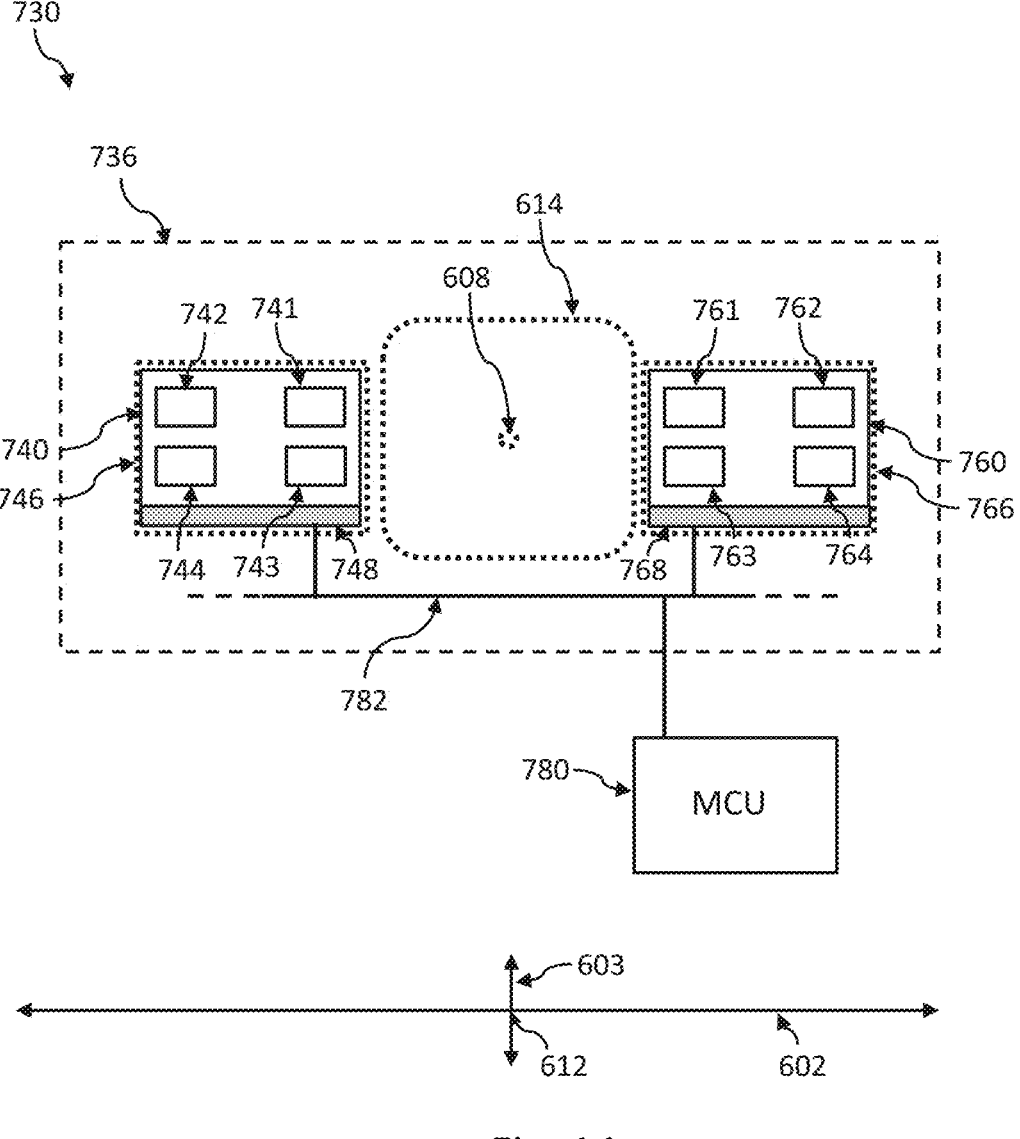
FIG. 14 is a schematic plan view of a layout of a user-input system including two force-measuring devices and a controller.

FIG. 14 shows a schematic plan view of a user-input system 730. User-input system 730 includes a cover layer 736 and force-measuring devices 740, 760. Each force-measuring device (740, 760) is coupled to the inner surface of the cover layer at a respective contact region (746, 766) and arranged such that the force-measuring devices 740, 760 are separated from each other along a longitudinal axis (X-axis) 602. The virtual button 614 is positioned between the force-measuring devices 740, 760 along the X-axis 602. In the example shown, each force-measuring device includes four piezoelectric micromechanical force-measuring elements (PMFEs). Force-measuring device 740 includes PMFEs 741, 742, 743, and 744. Force-measuring device 760 includes PMFEs 761, 762, 763, and 764.

Each force-measuring device (740, 760) includes a respective signal processor (748, 768). Each of the PMFEs (741, 742, 743, 744) of the first force-measuring device 740 is configured to output voltage signals to the signal processor 748 in accordance with a time-varying strain at the respective PMFE. Each of the PMFEs (761, 762, 763, 764) of the second force-measuring device 760 is configured to output voltage signals to the signal processor 768 in accordance with a time-varying strain at the respective PMFE. For example, signal processor 748 is configured to obtain force-trend data from the PMFEs 741, 742, 743, and 744. For example, signal processor 768 is configured to obtain force-trend data from the PMFEs 761, 762, 763, and 764. In the example shown, the user-input system 730 additionally includes a microcontroller (MCU) 780. MCU 780 is electronically coupled to the force-measuring devices 740, 760 via a bus wiring 782. MCU 780 is configured to receive the force-trend data from the respective signal processor (748, 768) of the force-measuring devices 740, 760. MCU 780 is configured to assess a user input (e.g., to determine that there has been a "real" user input or to determine that there has not been a user input) at virtual button 614 in accordance with the force-trend data for the force-measuring devices (740, 760) corresponding to the virtual button 614.

MCU 780 can be connected to additional force-measuring devices that are not shown in FIG. 14. For example, the additional force-measuring devices correspond to additional virtual button. In that case, MCU 780 can be configured to receive the force-trend data from the respective signal processor of the additional force-measuring devices. The microcontroller 780 is configured to assess a user input at one of the virtual buttons.

Figure 15:
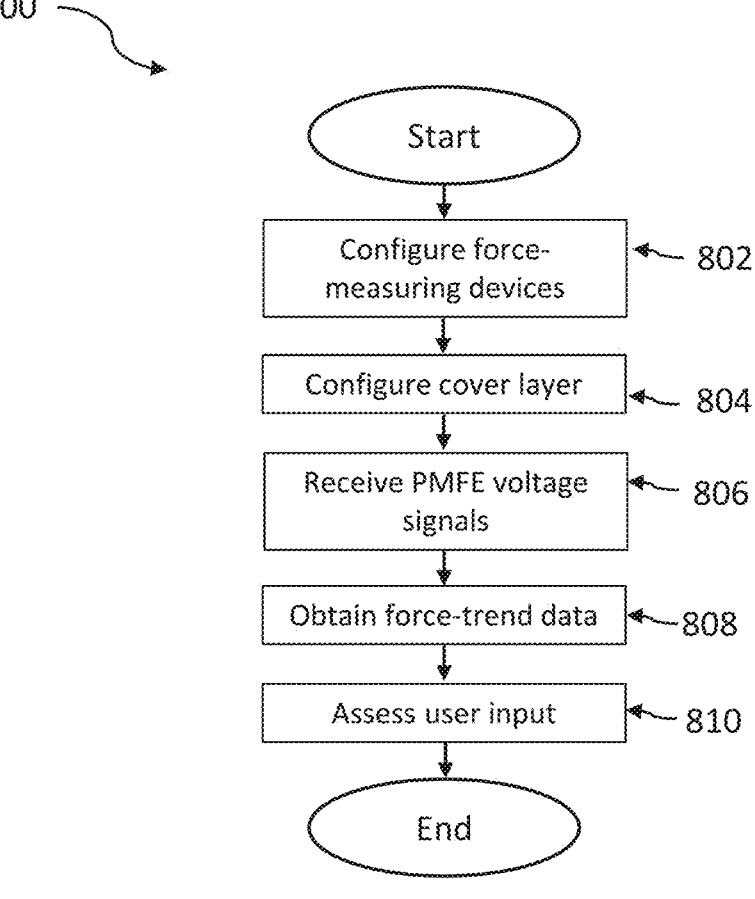
FIG. 15 is a flow diagram of a method of detecting a user input at a virtual button of a user-input system.

FIG. 15 is a flow diagram of a method 800 of detecting a user input at a virtual button of a user-input system. Method 800 includes steps 802, 804, 806, 808, and 810. Step 802 includes configuring at least one force-measuring device including a respective plurality of piezoelectric micromechanical force-measuring elements (PMFEs). Each of the PMFEs is configured to output voltage signals to a respective signal processor in accordance with a time-varying strain at the respective PMFE. The PMFEs include a first PMFE and a second PMFE. Step 804 includes configuring a cover layer of the user-input system including coupling the force-measuring device(s) to the cover layer at respective positions that are displaced from a center point of the virtual button. Step 806 includes receiving, by each respective signal processor, the voltage signals from the PMFEs (PMFE voltage signals). Step 808 includes obtaining force-trend data from the PMFE voltage signals. Step 810 includes assessing a user input in accordance with the force-trend data. Step 808 can be carried out by the signal processor of the force-measuring device(s) or by a microcontroller coupled to the force-measuring device(s). Step 810 can be carried out by the signal processor of the force-measuring device(s) or by a microcontroller coupled to the force-measuring device(s).

What is claimed is:

1. A method of assessing a user input at a virtual button of a user-input system, comprising the steps of:
   configuring at least one force-measuring device, each force-measuring device comprising a respective plurality of piezoelectric micromechanical force-measuring elements (PMFEs), each of the PMFEs configured to output voltage signals to a respective signal processor in accordance with a time-varying strain at the respective PMFE, the respective plurality of PMFEs comprising a respective first PMFE and a respective second PMFE;

configuring a cover layer of the user-input system comprising coupling the force-measuring device(s) to the cover layer at respective positions that are laterally displaced from a center point of the virtual button;
   receiving, by each respective signal processor, the voltage signals from the respective PMFEs (PMFE voltage signals);
   obtaining force-trend data from the PMFE voltage signals; and
   assessing a user input in accordance with the force-trend data.

2. The method of claim 1, wherein:
   the force-trend data comprise, for each of the force-measuring devices, a difference between the data representing PMFE voltage signals from the first PMFE (Z1) and data representing PMFE voltage signals from the second PMFE (Z2); and
   assessing comprises comparing a magnitude of the difference to a predetermined threshold.

3. The method of claim 1, wherein:
   the at least one force-measuring device comprises a first force-measuring device and a second force-measuring device;
   the force-trend data comprises a difference between total sums of the first force-measuring device and of the second force-measuring device, the respective total sum being a sum of data representing PMFE voltage signals from the first PMFE (Z1) and data representing PMFE voltage signals from the second PMFE (Z2) of the respective force-measuring device; and
   assessing comprises comparing a magnitude of the difference to a predetermined threshold.

4. The method of claim 1, wherein:
   the at least one force-measuring device comprises a first force-measuring device and a second force-measuring device;
   upon configuring the cover layer, the first PMFE and the second PMFE of the first force-measuring device are, on average, at a first distance from the center point;
   upon configuring the cover layer, the first PMFE and the second PMFE of the second force-measuring device are, on average, at a second distance from the center point; and
   the first distance and the second distance are different.

5. The method of claim 1, wherein upon configuring the cover layer, the first PMFE and the second PMFE of each of the force-measuring devices are at different distances from the center point.

6. The method of claim 1, wherein:
   the at least one force-measuring device comprises a first force-measuring device and a second force-measuring device; and
   upon configuring the cover layer, the center point is positioned between the first force-measuring device and the second force-measuring device.

7. The method of claim 1, wherein obtaining is carried out by the signal processor of the force-measuring device(s) or by a microcontroller coupled to the force-measuring device(s).

8. The method of claim 1, wherein assessing is carried out by the signal processor of the force-measuring device(s) or by a microcontroller coupled to the force-measuring device(s).

9. The method of claim 1, wherein:

the respective plurality of PMFEs additionally comprises a third PMFE and a fourth PMFE; and upon configuring the cover layer, for each of the force-measuring devices, the first PMFE is near a first proximal corner of the force-measuring device as seen from the center point, the second PMFE is near a first distal corner of the force-measuring device as seen from the center point, the third PMFE is near the second proximal corner of the force-measuring device as seen from the center point, and the fourth PMFE is near the second distal corner of the force-measuring device as seen from the center point, the first distal corner being adjacent to the first proximal corner, the second proximal corner being adjacent to the first proximal corner, and the second distal corner being adjacent to the first distal corner and the second proximal corner.

10. The method of claim 9, wherein the force-trend data for each of the force-measuring devices comprises one or more of the following:

(1) a first longitudinal sum (Z1+Z2) of data representing PMFE voltage signals from the first PMFE (Z1) and data representing PMFE voltage signals from the second PMFE (Z2);

(2) a second longitudinal sum (Z3+Z4) of data representing PMFE voltage signals from the third PMFE (Z3) and data representing PMFE voltage signals from the fourth PMFE (Z4);

(3) a difference (Y-difference) between the first longitudinal sum and the second longitudinal sum;

(4) a proximal transverse sum (Z1+Z3) of data representing PMFE voltage signals from the first PMFE (Z1) and data representing PMFE voltage signals from the third PMFE (Z3);

(5) a distal transverse sum (Z2+Z4) of data representing PMFE voltage signals from the second PMFE (Z2) and data representing PMFE voltage signals from the fourth PMFE (Z4);

(6) a difference (X-difference) between the proximal transverse sum and the distal transverse sum;

(7) a total sum (Z1+Z2+Z3+Z4) of data representing PMFE voltage signals from the first PMFE (Z1), data representing PMFE voltage signals from the second PMFE (Z2), data representing PMFE voltage signals from the third PMFE (Z3), and data representing PMFE voltage signals from the fourth PMFE (Z4);

(8) a first longitudinal difference between data representing PMFE voltage signals from the first PMFE (Z1) and data representing PMFE voltage signals from the second PMFE (Z2);

(9) a second longitudinal difference between data representing PMFE voltage signals from the third PMFE (Z3) and data representing PMFE voltage signals from the fourth PMFE (Z4);

(10) a proximal transverse difference between data representing PMFE voltage signals from the first PMFE (Z1) and data representing PMFE voltage signals from the third PMFE (Z3);

(11) a distal transverse difference between data representing PMFE voltage signals from the second PMFE (Z2) and data representing PMFE voltage signals from the fourth PMFE (Z4);

(12) a first diagonal difference between data representing PMFE voltage signals from the first PMFE (Z1) and data representing PMFE voltage signals from the fourth PMFE (Z4); and

(13) a second diagonal difference between data representing PMFE voltage signals from the third PMFE (Z3) and data representing PMFE voltage signals from the second PMFE (Z2).

11. The method of claim 10, wherein assessing comprises one or more of the following:

comparing a magnitude of the Y-difference (3) to a first predetermined threshold; and comparing a magnitude of the X-difference (6) to a second predetermined threshold.

12. A user-input system, comprising:

at least one force-measuring device, each force-measuring device comprising a respective signal processor and a respective plurality of piezoelectric micromechanical force-measuring elements (PMFEs), each of the PMFEs configured to output voltage signals to the respective signal processor in accordance with a time-varying strain at the respective PMFE, the respective plurality of PMFEs comprising a respective first PMFE and a respective second PMFE; and a cover layer to which the force-measuring device(s) are coupled, each of the force-measuring device(s) being coupled to the cover layer at respective positions that are laterally displaced from a center point of a respective virtual button, each respective virtual button corresponding to one or more of the force-measuring devices;

wherein the signal processor of each force-measuring device is configured to receive the voltage signals from the respective PMFEs (PMFE voltage signals);

wherein at least one of the signal processors is configured to obtain force-trend data from the PMFE voltage signals; and wherein a user input is assessed in accordance with the force-trend data.

13. The user-input system of claim 12, wherein:

the force-trend data comprise, for each of the force-measuring devices, a difference between the data representing PMFE voltage signals from the first PMFE (Z1) and data representing PMFE voltage signals from the second PMFE (Z2); and the assessing of the user input comprises comparing a magnitude of the difference to a predetermined threshold.

14. The user-input system of claim 12, wherein:

the at least one force-measuring device comprises a first force-measuring device and a second force-measuring device for each respective virtual button;

the force-trend data comprise, for each virtual button, a difference between total sums of the first force-measuring device and of the second force-measuring device, the respective total sum being a sum of data representing PMFE voltage signals from the first PMFE (Z1) and data representing PMFE voltage signals from the second PMFE (Z2) of the respective force-measuring device; and the assessing of the user input comprises comparing a magnitude of the difference to a predetermined threshold.

15. The user-input system of claim 14, wherein:

the at least one force-measuring device comprises a first force-measuring device and a second force-measuring device for each respective virtual button;

the first PMFE and the second PMFE of the first force-measuring device are, on average, at a first distance from the respective center point;

the first PMFE and the second PMFE of the second force-measuring device are, on average, at a second distance from the respective center point; and the first distance and the second distance are different.

16. The user-input system of claim 14, wherein for each of the force-measuring devices, the first PMFE and the second PMFE are at different distances from the respective center point.

17. The user-input system of claim 12, the at least one force-measuring device comprises a first force-measuring device and a second force-measuring device; and the center point is positioned between the first force-measuring device and the second force-measuring device.

18. The user-input system of claim 12, wherein:

the respective plurality of PMFEs additionally comprises a third PMFE and a fourth PMFE; and for each of the force-measuring devices, the first PMFE is near a first proximal corner of the force-measuring device as seen from the center point, the second PMFE is near a first distal corner of the force-measuring device as seen from the center point, the third PMFE is near the second proximal corner of the force-measuring device as seen from the center point, and the fourth PMFE is near the second distal corner of the force-measuring device as seen from the center point, the first distal corner being adjacent to the first proximal corner, the second proximal corner being adjacent to the first proximal corner, and the second distal corner being adjacent to the first distal corner and the second proximal corner.

19. The user-input system of claim 18, wherein the force-trend data for each of the force-measuring devices comprises one or more of the following:

(1) a first longitudinal sum (Z1+Z2) of data representing PMFE voltage signals from the first PMFE (Z1) and data representing PMFE voltage signals from the second PMFE (Z2);

(2) a second longitudinal sum (Z3+Z4) of data representing PMFE voltage signals from the third PMFE (Z3) and data representing PMFE voltage signals from the fourth PMFE (Z4);

(3) a difference (Y-difference) between the first longitudinal sum and the second longitudinal sum;

(4) a proximal transverse sum (Z1+Z3) of data representing PMFE voltage signals from the first PMFE (Z1) and data representing PMFE voltage signals from the third PMFE (Z3);

(5) a distal transverse sum (Z2+Z4) of data representing PMFE voltage signals from the second PMFE (Z2) and data representing PMFE voltage signals from the fourth PMFE (Z4);

(6) a difference (X-difference) between the proximal transverse sum and the distal transverse sum;

(7) a total sum (Z1+Z2+Z3+Z4) of data representing PMFE voltage signals from the first PMFE (Z1), data representing PMFE voltage signals from the second PMFE (Z2), data representing PMFE voltage signals from the third PMFE (Z3), and data representing PMFE voltage signals from the fourth PMFE (Z4);

(8) a first longitudinal difference between data representing PMFE voltage signals from the first PMFE (Z1) and data representing PMFE voltage signals from the second PMFE (Z2);

(9) a second longitudinal difference between data representing PMFE voltage signals from the third PMFE (Z3) and data representing PMFE voltage signals from the fourth PMFE (Z4);

(10) a proximal transverse difference between data representing PMFE voltage signals from the first PMFE (Z1) and data representing PMFE voltage signals from the third PMFE (Z3);

(11) a distal transverse difference between data representing PMFE voltage signals from the second PMFE (Z2) and data representing PMFE voltage signals from the fourth PMFE (Z4);

(12) a first diagonal difference between data representing PMFE voltage signals from the first PMFE (Z1) and data representing PMFE voltage signals from the fourth PMFE (Z4); and

(13) a second diagonal difference between data representing PMFE voltage signals from the third PMFE (Z3) and data representing PMFE voltage signals from the second PMFE (Z2).

20. The user-input system of claim 19, wherein the assessing of the user input comprises one or more of the following:

comparing a magnitude of the Y-difference (3) to a first predetermined threshold; and comparing a magnitude of the X-difference (6) to a second predetermined threshold.

21. The user-input system of claim 12, wherein at least one of the signal processors is configured to assess the user input in accordance with the force-trend data.

22. The user-input system of claim 12, additionally comprising a microcontroller electronically coupled to the force-measuring devices, wherein the microcontroller is configured to assess the user input in accordance with the force-trend data.

* * * * *